US010877087B1

(12) United States Patent
Joharapurkar et al.

(10) Patent No.: US 10,877,087 B1
(45) Date of Patent: Dec. 29, 2020

(54) LOAD DIAGNOSTICS FOR AUDIO AMPLIFIERS

(71) Applicant: NXP B.V., Eindhoven (NL)

(72) Inventors: Ashutosh Ravindra Joharapurkar, Bangalore (IN); Arvind Sherigar, Bangalore (IN); Sounak Maji, Chittaranjan (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/690,323

(22) Filed: Nov. 21, 2019

(51) Int. Cl.
*G01R 31/28* (2006.01)
*H03F 3/183* (2006.01)
*H03F 3/217* (2006.01)
*H04R 29/00* (2006.01)
*H04R 3/00* (2006.01)
(Continued)

(52) U.S. Cl.
CPC ......... *G01R 31/2825* (2013.01); *G01R 31/50* (2020.01); *H03F 3/183* (2013.01); *H03F 3/2175* (2013.01); *H04R 3/00* (2013.01); *H04R 29/001* (2013.01); *H03F 2200/03* (2013.01); *H03F 2200/165* (2013.01); *H03M 3/458* (2013.01)

(58) Field of Classification Search
CPC ........ H03F 3/2175; H03F 3/183; H03F 3/185; H03F 3/2173; H03F 3/217; H03F 3/2171; H03F 2200/03; H03F 2200/331; H03F 2200/351; H03F 2200/165; H04R 3/00; H04R 3/007; H04R 29/001; H03M 3/02; H03M 3/45; H03M 3/464
See application file for complete search history.

(56) References Cited

U.S. PATENT DOCUMENTS 7,521,936 B2   4/2009 Stanley
2003/0122549 A1  7/2003 Chiozzi et al.
(Continued)

FOREIGN PATENT DOCUMENTS

WO   2009098609 A1   8/2009

OTHER PUBLICATIONS

Binet et al. (A fully integrated Class-D amplifier in 40nm CMOS with dynamic cascode bias and load current sensing) https://ieeexplore.ieee.org/stamp/stamp.jsp?tp=&arnumber=6942086 (Year: 2014).*

(Continued)

*Primary Examiner* — Yogeshkumar Patel
(74) *Attorney, Agent, or Firm* — Rajeev Madnawat

(57) ABSTRACT

An audio system has an amplifier having first and second power stages configurable to drive a speaker, each power stage having two transistors connected in series. Each of one or more analog-to-digital converters is connected to measure a corresponding voltage drop across a corresponding transistor. A processor is connected to characterize the operation of the audio system based on the measured voltage drops. The ADC(s) and the processor can be used during start-up and/or run-time operations of the audio system to determine or detect transistor ON resistance, system lag time, speaker current, open-load faults, shorted-load faults, and short-to-Vdd/Vss faults. To avoid errors, the processor determines or detects and avoids under-drive conditions, high-frequency conditions, ripple-current periods, and lag-time periods while characterizing the system operations.

25 Claims, 7 Drawing Sheets

(51) Int. Cl.
*G01R 31/50* (2020.01)
*H03M 3/00* (2006.01)

(56) References Cited

U.S. PATENT DOCUMENTS

2007/0153780 A1* 7/2007 Stanley .............. G01R 31/007
  370/360
2017/0350923 A1* 12/2017 Mostert .............. G01R 31/2825

OTHER PUBLICATIONS

Nagari et al. (An 8-2.5 W 1%-THD 104 dB(A)-Dynamic-Range Class-D Audio Amplifier With Ultra-Low EMI System and Current Sensing for Speaker Protection) https://ieeexplore.ieee.org/stamp/stamp.jsp?tp=&arnumber=6365768 (Year: 2012).*

Krishna et al. (Speaker load diagnostics for switching automotive audio amplifiers) https://ieeexplore.ieee.org/stamp/stamp.jsp?tp=&arnumber=7791119 (Year: 2016).*

Janak, Derek et al., "Class-D Amplifier External Load Diagnostics," Texas Instruments Application Report, Jan. 2017, pp. 1-10, Texas Instruments Incorporated, Dallas, TX, retrieved from the internet on Aug. 13, 2019 at: http://www.ti.com/lit/an/slva824/slva824.pdf.

Brennan, Sean, "Measuring a Loudspeaker Impedance Profile Using the AD5933," AN-843: Analog Devices Application Note, 2007, pp. 1-12, Rev. A, Analog Devices, Inc., Norwood, MA, retrieved from the internet on Aug. 13, 2019 at: https://www.analog.com/media/en/technical-documentation/application-notes/236037846AN_843.pdf.

Krishna, Kannan et al., "Speaker Load Diagnostics for Switching Automotive Audio Amplifiers," IEEE Dallas Circuits and Systems Conference (DCAS), Oct. 2016, pp. 1-4, IEEE, Arlington, TX.

* cited by examiner

LOAD DIAGNOSTICS FOR AUDIO AMPLIFIERS

BACKGROUND

It is desirable to efficiently and accurately characterize the performance of amplifiers used in audio applications. While this implies the need for a system to accurately measure the speaker load connected to the output of an audio amplifier as well as the phase lag of the speaker load during the amplifier start-up, it also requires continuously monitoring the presence of speaker load and/or occurrence of any faults during the amplifier run-time operations. Desirably, all these should be achieved using as little power and as little layout area as possible.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

As used herein, the singular forms "a", "an", and "the", are intended to include the plural forms as well, unless the context clearly indicates otherwise. It further will be understood that the terms "comprises", "comprising", "has", "having", "includes", or "including" specify the presence of stated features, steps, or components, but do not preclude the presence or addition of one or more other features, steps, or components. It also should be noted that, in some alternative implementations, the functions/acts noted might occur out of the order noted in the figures. For example, two figures shown in succession may in fact be executed substantially concurrently or may sometimes be executed in the reverse order, depending upon the functionality/acts involved. The term "or" is to be interpreted as inclusive unless indicated otherwise.

In an embodiment, the present invention is a method for characterizing operation of an audio system comprising a speaker driven by first and second power stages of an amplifier, each power stage comprising two transistors connected in series. The method comprises (a) measuring a first voltage drop across a first of the transistors using a first analog-to-digital converter (ADC) and (b) characterizing the operation of the audio system based on the measured first voltage drop.

In another embodiment, the present invention is an audio system comprising an amplifier having first and second power stages configurable to drive a speaker, each power stage comprising two transistors connected in series; a first ADC connected to measure a first voltage drop across a first of the transistors; and a processor connected to characterize the operation of the audio system based on the measured first voltage drop.

Figure 1:
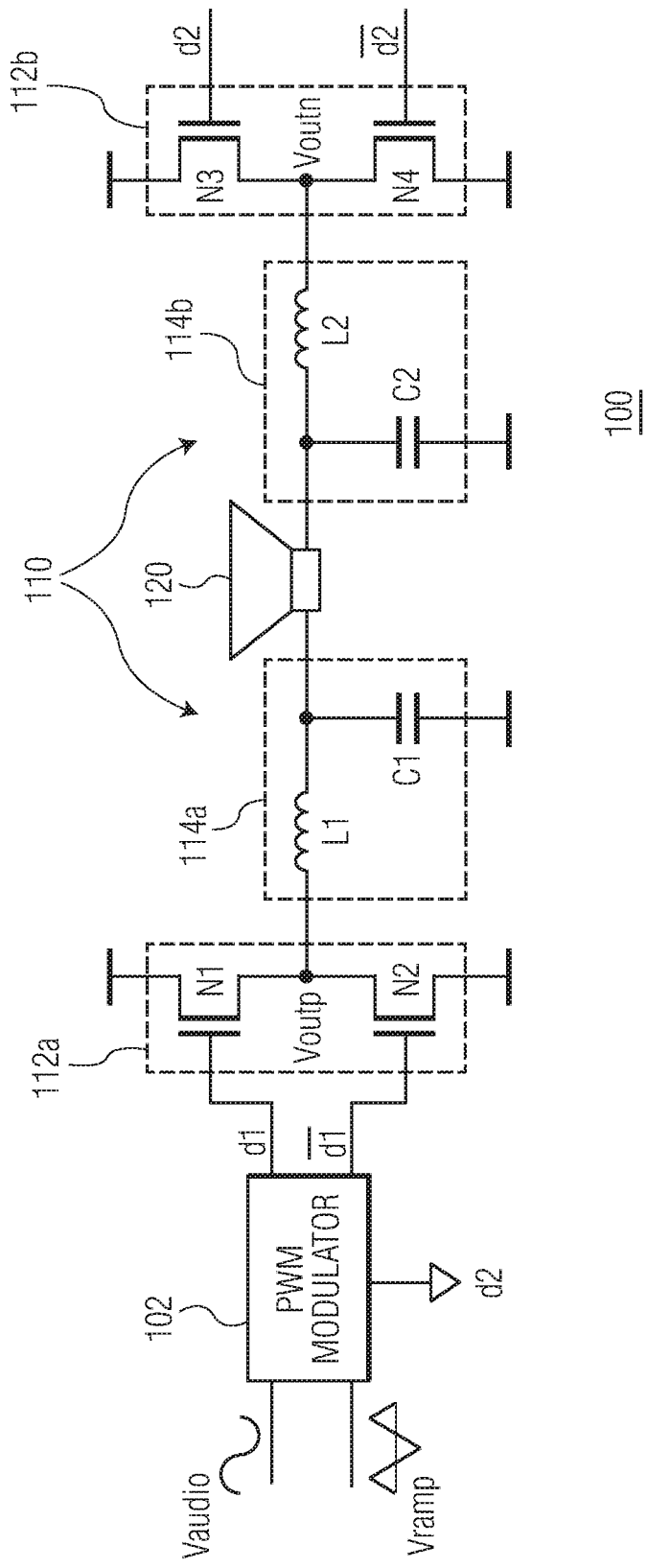
FIG. 1 is schematic block diagram of a conventional audio system.

FIG. 1 is schematic block diagram of a conventional audio system 100 comprising an audio source 102, such as a pulse-width modulator (PWM), complementary power stages 112*a* and 112*b*, LC filters 114*a* and 114*b*, and a speaker AE, where the first and second power stages 112*a* and 112*b* and the first and second LC filters 114*a* and 114*b* form a fully differential Class D audio amplifier 110 with the speaker AE as the bridge-tied load of the amplifier 110.

The PWM modulator 102 converts audio input signals Vaudio and Vramp into the amplifier drive signals d1 and d2, which drive the amplifier 110, which in turn generates an amplified differential output Voutp, Voutn that drives, via the LC filters 114*a* and 114*b*, the speaker AE, which converts the electrical signals Voutp, Voutn into an acoustic output (i.e., sound).

In particular, for the first power stage 112*a*, signal d1 is applied to the gate of the NFET N1, while the complementary signal $\overline{d1}$ is applied to the gate of the NFET N2. Similarly, for the second power stage 112*b*, signal $\overline{d2}$ is applied to the gate of the NFET N3, while the complementary signal d2 is applied to the gate of the NFET N4. In alternative implementations, the NFETs N1 and N3 are replaced by PFETs, and the drive signal d1 is applied to both FETs in the first power stage, and the drive signal d2 is applied to both FETs in the second power stage.

Figure 2:
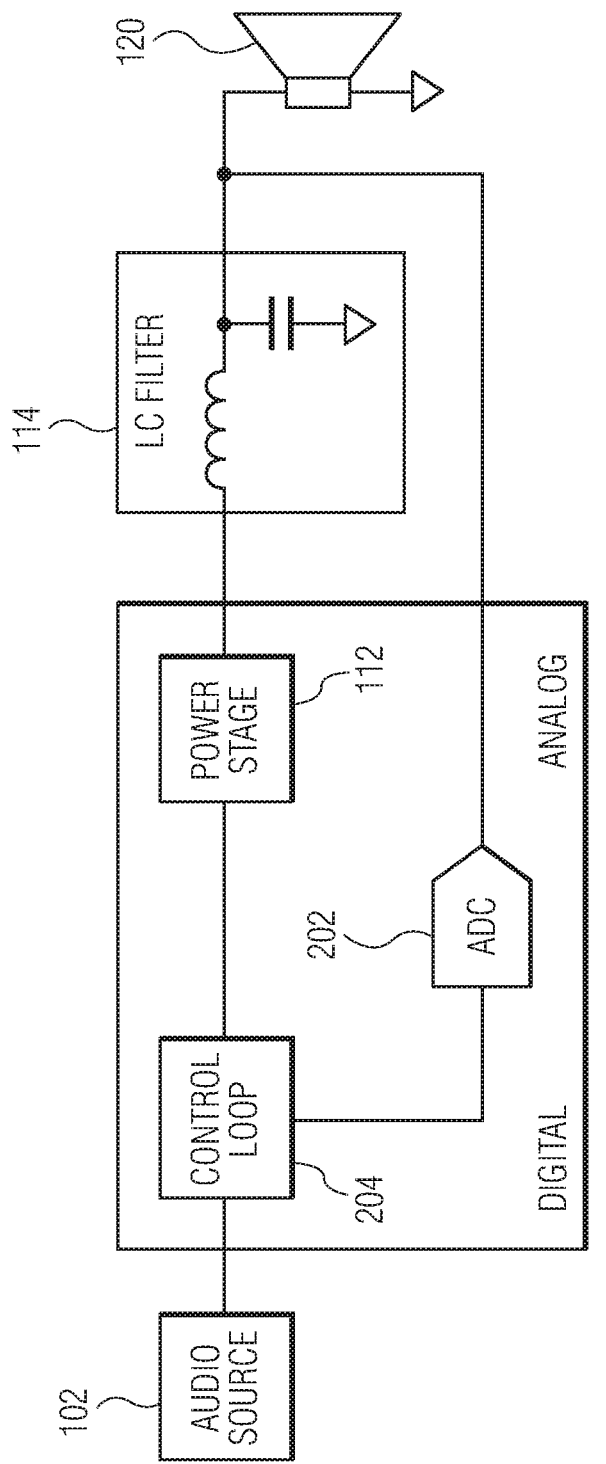
FIG. 2 is a schematic block diagram representing one conventional technique for performing external LC filter compensation for the amplifier of FIG. 1.

FIG. 2 is a schematic block diagram representing one conventional technique for performing external LC filter compensation for the amplifier 110 of FIG. 1. Note that FIG. 2 shows just one half of the amplifier 110 of FIG. 1. As shown in FIG. 2, a portion of the analog output of the LC filter 114 is fed back, digitized by an analog-to-digital converter (ADC) 202, and used by the digital control loop 204 to perform conventional LC filter compensation. The technique of FIG. 2 is referred to as a "feedback after filter" technique because the feedback signal is tapped after the LC filter 114.

Figure 3:
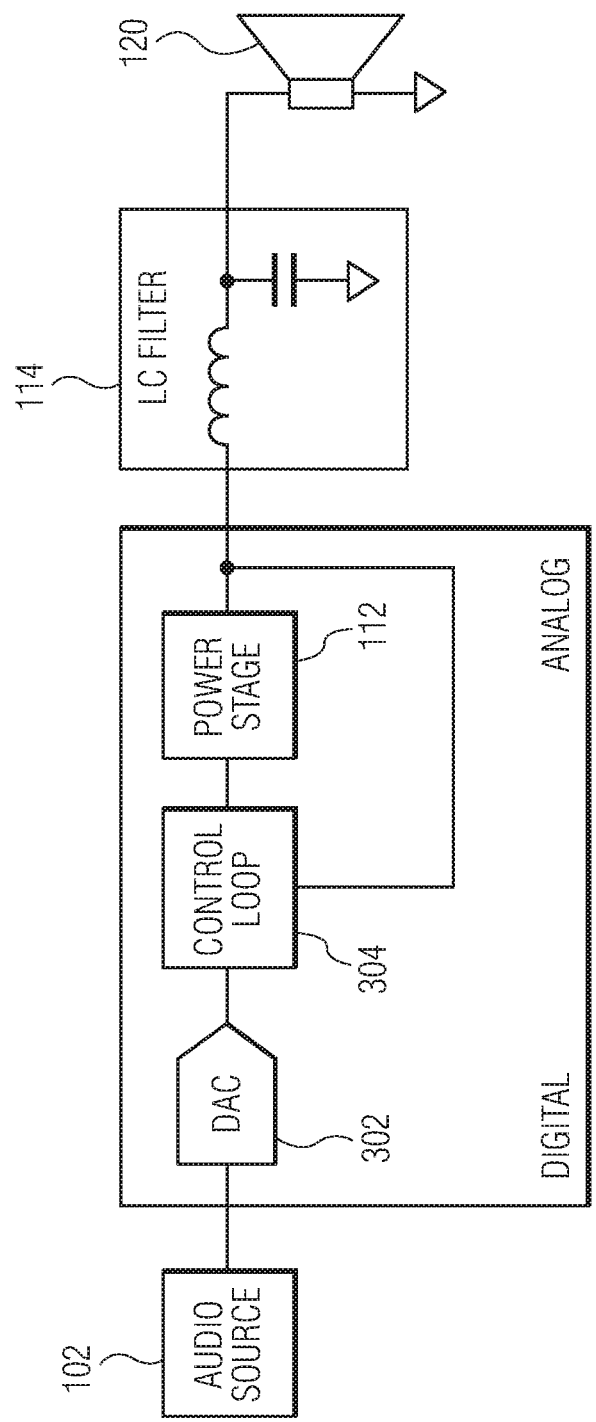
FIG. 3 is a schematic block diagram representing another conventional technique for performing external LC filter compensation for the amplifier of FIG. 1.

FIG. 3 is a schematic block diagram representing another conventional technique for performing external LC filter compensation for the amplifier 110 of FIG. 1. Note that FIG. 3 shows just one half of the amplifier 110 of FIG. 1. As shown in FIG. 3, a portion of the analog output of the power stage 112 is fed back and used by the analog control loop 304 to perform conventional LC filter compensation. The technique of FIG. 3 is referred to as a "feedback before filter" technique because the feedback signal is tapped before the LC filter 114.

Note that, in the implementation of FIG. 2, the power stage 112 is driven by digital signals from the digital control loop 204, while, in the implementation of FIG. 3, the power stage 112 is driven by signals from the analog control loop 304, where the digital drive signals from the audio source 102 are converted into the analog domain by a digital-to-analog converter (DAC) 302.

Figure 4:
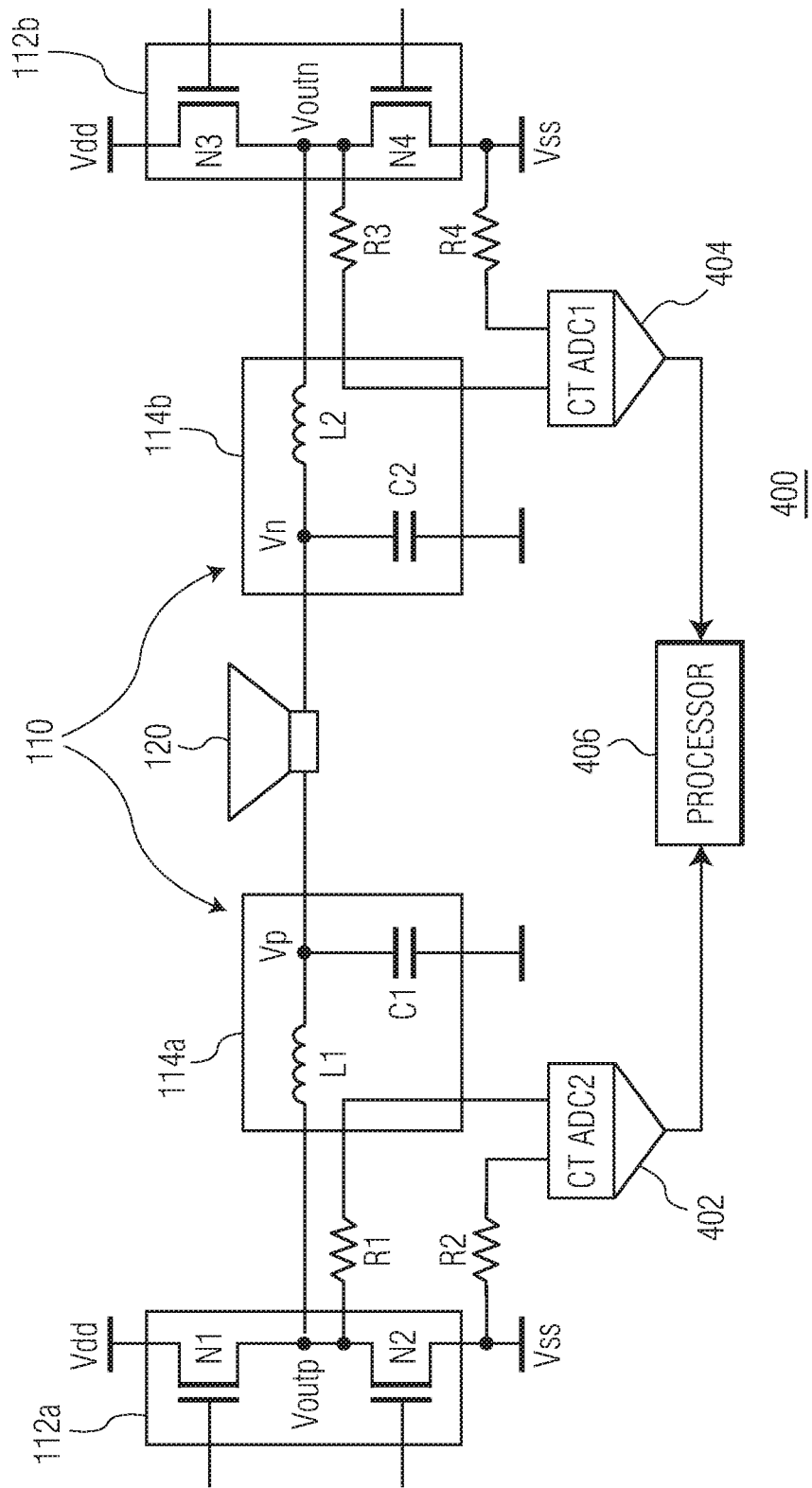
FIG. 4 is a schematic block diagram of an audio system configured to characterize the operations of the audio system of FIG. 1, according to one embodiment of the present invention.

FIG. 4 is a schematic block diagram of an audio system 400 configured to characterize the operations of the audio system 100 of FIG. 1, according to one embodiment of the present invention. The audio system 400 is identical to the audio system 100 of FIG. 1, except that the audio system 400 includes (i) the continuous-time (CT) sigma-delta ADC 402 connected across the channel of the NFET N2 via the (optional) resistors R1 and R2, (ii) the CT sigma-delta ADC 404 connected across the channel of the NFET N4 via the (optional) resistors R3 and R4, and (iii) the processor 406 configured to process the digital signals generated by the ADCs 402 and 404, which function as binary-coded decimal (BCD) comparators that measure the voltage drops Vds across the NFETs N2 and N4, respectively, with sufficiently high resolution to detect relatively small changes in current flowing through those NFETs.

Note that, although not shown in FIG. 4, the audio system 400 includes an audio source similar to the audio source 102 of FIG. 1 that generates the drive signals for the power stages 112a and 112b.

Those skilled in the art will understand that, in some alternative implementations, ADCs are connected across the NFETs N1 and N3 instead of or in addition to the ADCs 402 and 404 that connected across the NFETs N2 and N4. Furthermore, in some alternative implementations, suitable transistor devices other than FETs can be used instead of the NFETs N1-N4.

Although NFETs N1-N4 are depicted in FIGS. 1 and 4 as individual transistors, in some implementations, each NFET is implemented using a plurality of n-type transistors connected in parallel and individually controllable, such that a part of each NFET can be turned on by turning on only a subset of the transistors that make up that NFET. Alternatively or in addition, in some implementations, it may be possible to partially turn on individual transistors.

Run-Time Operations

The audio system 400 can be used to characterize the operations of the amplifier 110 during run time in which the amplifier 110 is switching between positive and negative switching cycles as the speaker AE is driven to generate sound.

During a positive switching cycle of the amplifier 110 when the NFETs N1 and N4 are on and the NFETs N2 and N3 are off, current flows from the positive rail Vdd through the NFET N1, the inductor L1, the speaker AE, the inductor L2, and the NFET N4 to the negative rail Vss, and the ADC 404 measures the voltage drop vds across the NFET N4. If the FET ON resistance Rsw is known, then the current Isw flowing through the NFET N4 can be determined from Ohm's law using the equation Vds=Rsw*Isw. Note that, since the current Isw flowing through the NFET N4 is substantially equal to the load current iL1 flowing through the speaker AE, the processor 406 can use this technique to determine the speaker current iL1.

Similarly, during a negative switching cycle of the amplifier 110 when the NFETs N2 and N3 are on and the NFETs N1 and N4 are off, current flows from the positive rail Vdd through the NFET N3, the inductor L2, the speaker AE, the inductor L1, and the NFET N2 to the negative rail Vss, and the ADC 402 measures the voltage drop vds across the NFET N2. Here, too, the current Isw flowing through the NFET N2 can be determined from the equation Vds=Rsw*Isw. Note that, since the current Isw flowing through the NFET N2 is substantially equal to the load current iL1 flowing through the speaker AE, the processor 406 can also use this technique to determine the speaker current iL1.

A technique for determining the FET ON resistances of the NFETs N2 and N4 during start-up operations is described further below.

The audio system 400 of FIG. 4 can also be used to perform run-time fault detection for open-load faults, shorted-load faults, and short-to-Vdd/Vss faults in the amplifier 110.

In an open-load fault, no current flows through the speaker AE. As such, the processor 406 can detect an open-load fault by monitoring the voltage drop Vds across the NFET N4 during positive switching cycles and/or the voltage drop Vds across the NFET N2 during negative switching cycles for a sudden decrease in voltage level. In one implementation, the magnitude of the decrease in Vds is compared to a threshold to detect an open-load fault. In another implementation, the magnitude of Vds is compared to a low-voltage threshold to detect an open-load fault. Note that the threshold is pre-set based on both speaker impedance and FET on resistance Rsw (to be determined during start-up diagnostics).

Analogously, in a shorted-load fault, the resistance across the speaker AE approaches or even reaches zero. As such, the processor 406 can detect a shorted-load fault by monitoring the voltage drop Vds across the NFET N4 during positive switching cycles and/or the voltage drop Vds across the NFET N2 during negative switching cycles for a sudden increase in voltage level. In one implementation, the magnitude of the increase in Vds is compared to a threshold to detect a shorted-load fault. In another implementation, the magnitude of Vds is compared to a high-voltage threshold to detect a shorted-load fault.

A short-to-Vdd fault occurs when either speaker terminal Vp or Vn is shorted to the positive rail Vdd. A short-to-Vss fault occurs when either the speaker terminal Vp or Vn is shorted to the negative rail Vss. A short-to-Vdd fault at the speaker terminal Vp can be detected during a negative switching cycle when the output of the ADC 402 rapidly approaches Vdd. Similarly, a short-to-Vdd fault at the speaker terminal Vn can be detected during a positive switching cycle when the output of the ADC 404 rapidly approaches Vdd. A short-to-Vss fault at the speaker terminal Vp can be detected during a negative switching cycle when the output of the ADC 402 goes negative. Similarly, a short-to-Vss fault at the speaker terminal Vn can be detected during a positive switching cycle when the output of the ADC 404 goes negative.

During operation of the amplifier 110, FET temperatures may increase due to self-heating. The FET ON resistance Rsw varies proportionally with FET temperature. As such, for constant speaker current iL1, as the temperature increases, the FET ON resistance Rsw and the voltage drop Vds across the FET both increase. In some situations, the increase in the voltage drop Vds due to an increase in FET temperature is similar to the increase in Vds that occurs during a shorted-load fault. One difference between a temperature increase and a shorted-load fault is that an Over Current Detection (OCD) event occurs during a shorted-load fault, but not during a temperature increase. The processor 406 can detect an OCD event when the processor 406 determines that the speaker current iL1 exceeds a specified threshold level. In this way, the processor 406 can detect and distinguish between temperature increases and shorted-load faults and thereby provide FET over-heating protection in addition to the detection of shorted-load faults.

The processor 406 can detect significant increases in Vds that correspond to significant increases in NFET resistance to monitor the NFET temperature and protect the NFET from damage. Note that $(Vds)^2$ is proportional to the temperature of the NFET.

When the input signals applied to the amplifier 110 are too low (i.e., under-drive or low-volume situations), the corresponding voltage drops Vds may behave similarly to those during open-load faults. Similarly, when the input signals are too high (i.e., over-drive or high-volume situations), the corresponding voltage drops Vds may behave similarly to those during shorted-load faults. To avoid false positive detections in which under-drive and over-drive situations are mistakenly identified as open-load and shorted-load faults, respectively, the processor 406 can be configured to monitor the input signals to restrict fault-detection processing to occur during periods in which the input signals are not under-driven. When the input signals are under-driven, currents are small, and the reliability of their detection is not good. As such, fault-detection processing should be avoided during these time periods. When the input signals are of reasonable amplitude or over-driven, the currents are high and can be measured reliably. During these time periods, the processor 406 can perform fault-detection processing using suitably adjusted thresholds.

Furthermore, when the frequency of the input signal is too high, the ADCs 402 and 404 might not be able to integrate fast enough to generate accurate measures of Vds, which can also result in false-positive fault detections. Here, too, the processor 406 can be configured to monitor the input signals to restrict fault-detection processing to occur during periods in which the input-signal frequency is less than a specified high-frequency threshold level. In some implementations, a suitable zero-crossing detector (not shown in FIG. 4) can be used to determine the frequency of the input signal. In particular, when the processor 406 detects that the number of zero crossings within a given time period is greater than a specified threshold, then the processor 406 determines that the frequency of the input signal is too high to generate accurate measures of Vds.

It is known that ripple currents occur when the amplifier 110 transitions between the positive and negative switching cycles. Characterizing the operations of the amplifier 110 when those ripple currents occur can lead to faulty characterizations of those operations. Such ripple-current errors are dominant for speakers AE having relatively high impedances, e.g., about 16-32 ohms. In order to avoid those faulty characterizations, the processor 406 monitors the voltage drops Vds across the NFET N2 during negative switching cycles and across the NFET N4 during positive switching cycles for voltage fluctuations that are indicative of ripple currents and then avoids those periods of voltage fluctuation such that the operations of the amplifier 110 are characterized only during quiescent periods in which the voltage drops Vds are relatively stable.

According to one possible implementation, the number of zero crossings in the input signal that occur over a specified period of time is compared to a threshold to distinguish between ripple-current periods (greater than threshold) and quiescent periods (not greater than threshold). According to another possible implementation, the peak-to-peak magnitude of the fluctuations in voltage drop Vds over a specified period of time is compared to a threshold. According to yet another possible implementation, the variance in voltage drop Vds over a specified period of time is compared to a threshold. Other suitable techniques may also be used.

Note that the audio system 400 of FIG. 4 can be implemented for amplifiers 110 that perform either the "feedback after filter" technique of FIG. 2 or the "feedback before filter" technique of FIG. 3.

By sampling relatively small fractions of the power generated by the power stages 112a and 112b to be applied to the ADCs 402 and 404, run-time operations of the amplifier 110 can be characterized without adversely affecting quality of the sound generated by the speaker AE. Suitable small fractions of power can be achieved by selecting sufficiently large resistance levels for resistors R1-R4.

Due to the inductive nature of the speaker load, the load current iL1 through the speaker AE lags in phase to the voltage across the speaker AE. When the input signal is monitored for zero crossing (e.g., negative to positive), the average current in the speaker load can still be negative since the current lags the input signal. This can result in wrong measurement of current through the speaker (since current and hence Vds drop is still negative when it is meant to be positive) and hence wrong load detection. These phase-lag errors are dominant for speakers AE having relatively low impedances, e.g., about 1-2 ohms, and/or for audio signals having high frequencies, e.g., greater than about 6 kHz.

To avoid such phase-lag errors, the processor 406 is configured to ignore voltage drop Vds samples during the phase-lag period and uses only Vds samples that occur after the phase-lag period. A technique for determining the phase lag that is performed during start-up operations is described further below.

To be safe, in some implementations, the processor 406 is configured to avoid both the ripple-current periods as well as the phase-lag periods when characterizing the run-time operations of the amplifier 110.

As mentioned earlier, run-time operation of the amplifier 110 may lead to increase in FET ON resistance Rsw (due to FET self-heating). It is interesting to study how this affects the detectability of the open and/or shorted-load faults. An increase in Rsw will lead to an increase (from normal operation) in voltage drop Vds. So, when an open-load fault occurs, the decrease in Vds (to zero) is more than the pre-set threshold in processor 406, thus a better detection technique. A similar situation exists for shorted-load faults.

Figure 5:
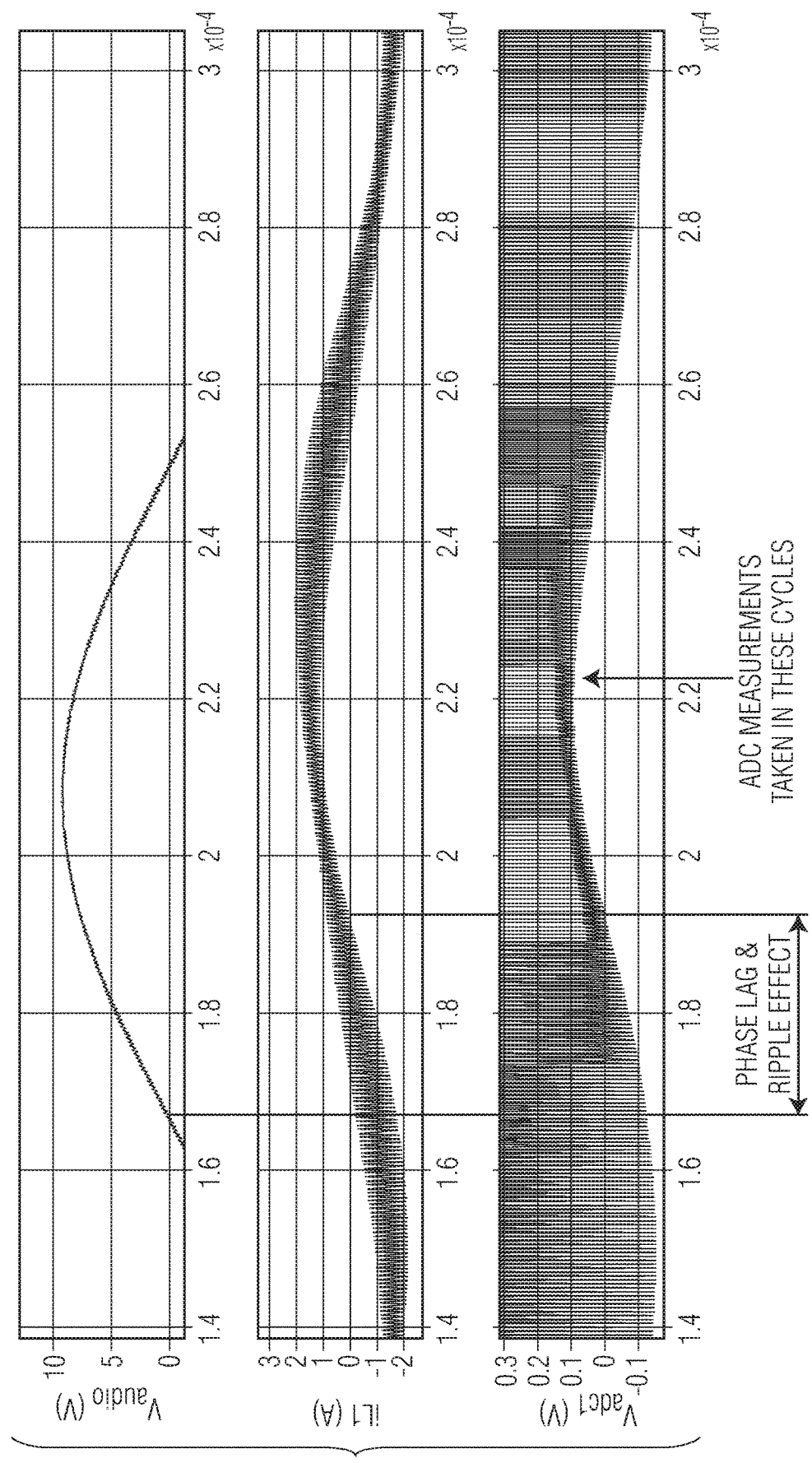
FIG. 5 shows graphical representations of the input voltage Vaudio, the load current iL1, and the voltage Vadc1 measured by the ADC 404.
Figure 6:
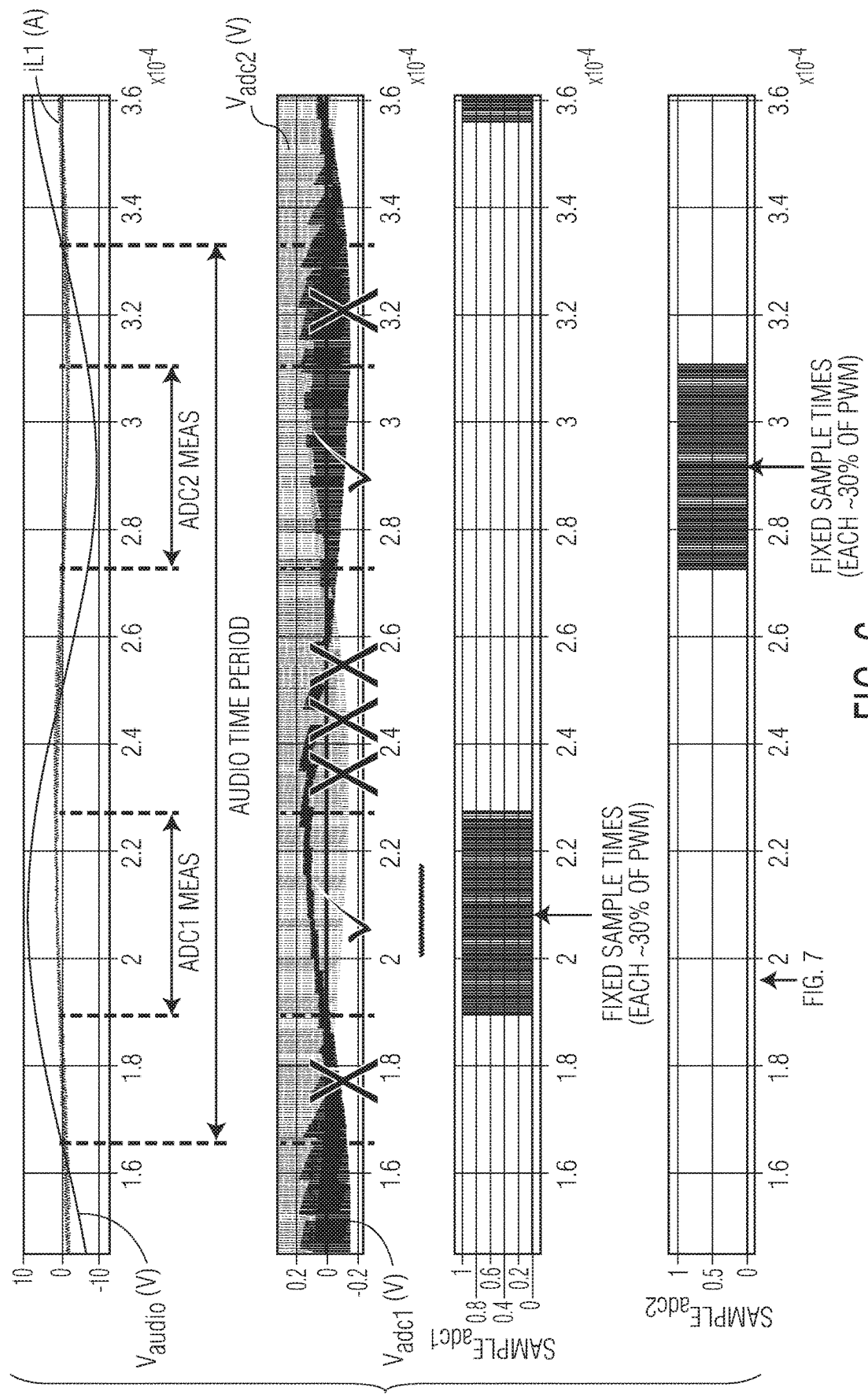
FIG. 6 shows graphical representations of the input voltage Vaudio, the load current iL1, the voltage Vadc1 measured by the ADC 404, the voltage Vadc2 measured by the ADC 402, and the samples of the voltage Vadc1 and the voltage Vadc2 used to characterize system performance.
Figure 7:
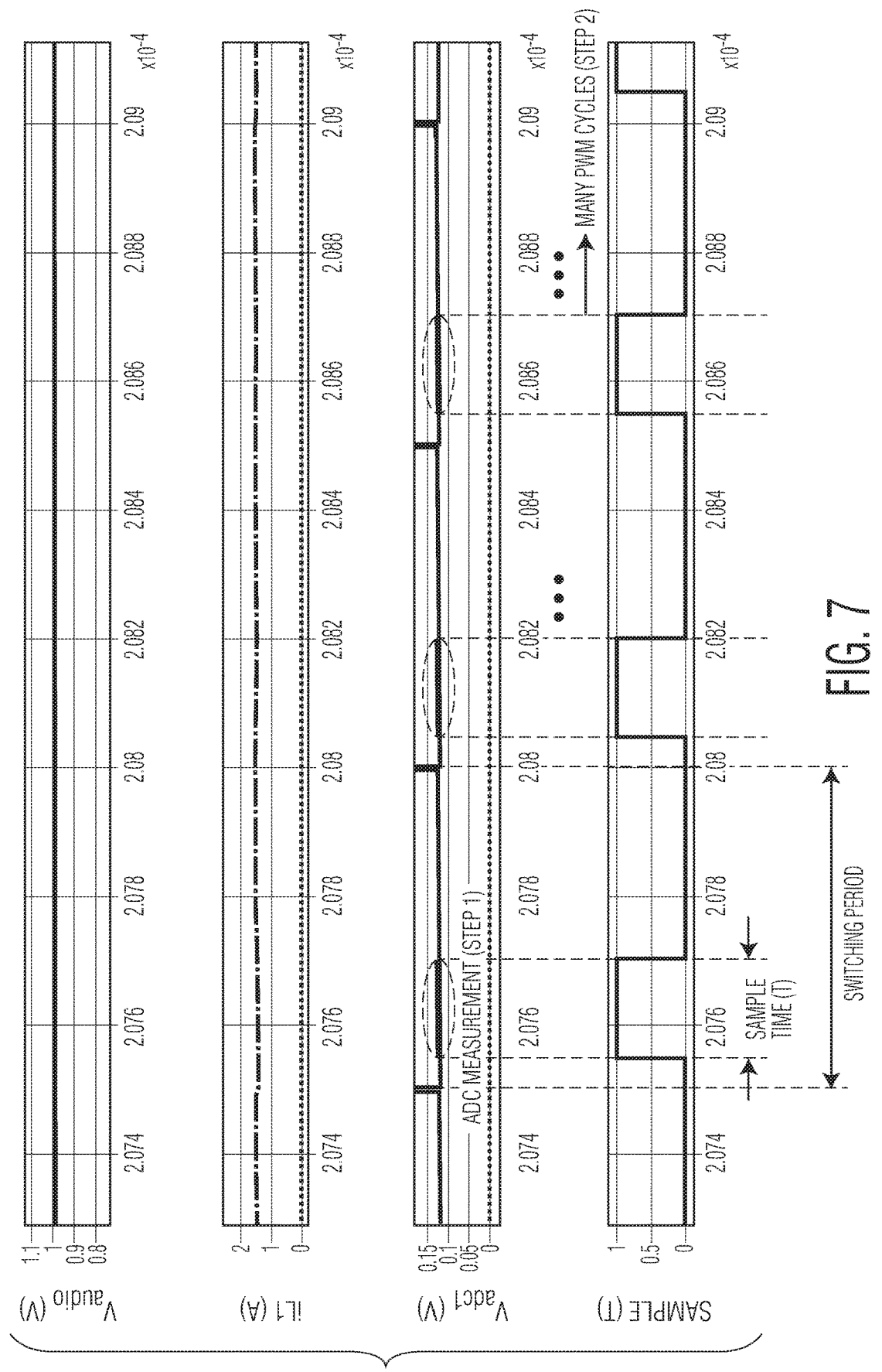
FIG. 7 shows graphical representations of the input voltage Vaudio, the load current iL1, the voltage Vadc1, and the sampling waveform for a few of the Vadc1 samples of FIG. 6.

FIGS. 5-7 show graphical representations of the points highlighted above, depicting the errors in ADC measurements and the possible mitigations adopted in the system to avoid those errors.

FIG. 5 shows graphical representations of the input voltage Vaudio, the load current iL1, and the voltage Vadc1 measured by the ADC 404. FIG. 5 demonstrates the phase lag between the load current iL1 and voltage Vadc1 and also the effect of ripple current. As indicated in FIG. 5, ADC measurements used to characterize system performance are taken after the phase lag and during periods of relatively low ripple current (i.e., quiescent periods).

FIG. 6 shows graphical representations of all the voltage and current waveforms used to characterize system performance. FIG. 6 shows the periods of usable Vadc1 and Vadc2 measurements during a complete audio cycle (denoted by ticks). Fixed sample times denote the fixed sampling times of the ADC 404 (or 402) in one PWM switching cycle.

FIG. 7 shows graphical representations of the input voltage Vaudio, the load current iL1, the voltage Vadc1, and the sampling waveform for a few of the Vadc1 samples of FIG. 6. It is a zoomed-in version of FIG. 6, depicting a snapshot when both the current and Vds drops are positive during a positive audio cycle.

Start-Up Operations

As described above, if the FET ON resistance Rsw is known, then the speaker current Isw in the audio system 100 of FIG. 1 can be monitored during run-time operations using the audio system 400 of FIG. 4 to measure and track the voltage drops Vds across appropriate NFETs in the amplifier power stages 112a and 112b. One way to determine the FET ON resistance Rsw is to inject a known current Isw into the audio system 400 prior to run-time operations (i.e., during off-line, start-up operations) and use the appropriate ADC 402 or 404 to determine the voltage drop Vds for that known current.

In one possible implementation, a digital current source (i.e., an IDAC, not shown in FIG. 4) can be used to inject a known DC current into the audio system 400 at the node Voutp with suitable gate voltage applied to turn the NFET N2 on (with all other NFETs off), and the ADC 402 can be used to measure the voltage drop Vds across the NFET N2. The processor 406 can then determine the FET ON resistance Rsw from Ohm's law Vds=Isw*Rsw.

Note that, for similarly sized NFETs N2 and N4, the FET ON resistance Rsw for the NFET N4 can be assumed to be the same as the FET ON resistance Rsw for the NFET N2. Alternatively, the ON resistance of the NFET N4 can be determined by injecting a DC current at the node Voutn with the NFET N4 on (and all other NFETs off) and using the ADC 404 to measure the voltage drop Vds across the NFET N4. At least part of the NFET N4 can also be turned ON to reduce the required DC current, as it will substantially increase the Vds across the NFET N4. This allows measurement of the switch resistance of the NFET N4 in a small area.

The DC load impedance of speaker AE can be determined by injecting a small, known DC current, e.g., at the node Voutp with the NFET N4 on (and all other NFETs off) and using the ADC 402 to measure the voltage at node Voutp. The processor 406 can then determine the speaker impedance using Ohm's law since the voltage drop Vds across the NFET N4 will be negligible. Alternatively, the speaker's DC load impedance can be determined by implementing a similar procedure using the node Voutn, the NFET N2, and the ADC 404. The DC load diagnostics have high accuracy since losses are negligible.

As mentioned previously, the processor 406 is configured to avoid characterizing run-time amplifier operations during lag-time periods. The lag time across the speaker AE can be determined during start-up operations by injecting a small, known AC current, e.g., at the node Voutp with at least part of the NFET N4 turned on (with all other NFETs off), such that a reasonable voltage drop Vds can be detected across the NFET N4 by the ADC 404. Using the ADC 402 to track the voltage at the node Voutp and the ADC 404 to track the voltage at the node Voutn, the processor 406 can determine the phase lag across the speaker AE based on the time difference between the peaks in the measured voltages at the nodes Voutp and Voutn.

The AC load impedance of the speaker AE can be determined using the equation (Voutp−Voutn)/Isw. Note that the current lost in the capacitors C1 and C2 can be taken into account during the calculation. It can be shown that the speaker current is equal to (Iidac+Iadcdc)/2, where Iidac is the current from the IDAC digital current source and Iadcdc is equal to voltage measured by the ADC 404 divided by the FET on resistance Rsw determined earlier in the test. Hence (Voutp−Voutn)/Ispeaker is the actual ac load impedance. In another implementation, the loop around the two ADCs 402 and 404 and the IDAC can be closed using a simple digital controller.

Here, too, the phase lag and the AC load impedance of the speaker AE can be determined using an analogous procedure involving the injection of an AC current at the node Voutn with at least part of the NFET N2 turned on.

In a preferred implementation, the frequency and amplitude of the injected AC (or DC) current is selected to avoid having the speaker AE generate any human-audible pop sound during start-up operations. This also involves the build-up of IDAC current as a slow ramp signal.

Note that the IDAC (or a simple constant current source) can be used to inject a DC current in order to determine DC characteristics of the audio system 100. Alternatively, the IDAC can be used to inject a shifted AC current in order to determine simultaneously both AC and DC characteristics of the audio system 100. The use of high-resolution CT ADCs 402 and 404 (each having SNR around 80 dB) enables the use of a low-current IDAC which reduces both the size and non-linearity requirement for the IDAC. The IDAC current can be reduced even further to measure line driver loads.

Note further that all of the run-time diagnostic tests described in the previous section can also be performed during start-up operations using suitable input signals. Open and shorted-load faults can be detected during the IDAC current ramp-up process itself.

Although the invention has been described in the context of the audio system 400 of FIG. 4 having two ADCs 402 and 404, those skilled in the art will understand that the invention can also be implemented with only one ADC, where the processor 406 is configured to process outputs from that ADC during the appropriate corresponding switching cycles.

The various characterizations described in this disclosure, related to detecting fault conditions or determining the amplifier operating points, are geared towards several uses. While start-up diagnostics help the car manufacturers to check if a speaker is connected properly during the production phase, it can also help in early diagnosis and repair of multi-channel speaker systems (figuring out which one is not working). These speaker loads can be of different types such as a woofer or tweeter. It is also a customer requirement to exactly measure and characterize a speaker load before connecting it to their audio systems (sometimes the choice of output LC filter can also depend on this). While the runtime diagnostic is primarily a fault detection mechanism, it also allows continuous monitoring of speaker impedance over time and predicts any potential failure before it happens.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A method for characterizing operation of an audio system comprising a speaker driven by first and second power stages of an amplifier, each power stage comprising two transistors connected in series, the method comprising:
   (a) generating samples of a first voltage drop across a first of the transistors in the first power stage using a first analog-to-digital converter (ADC);
   (b) generating samples of a second voltage drop across a first of the transistors in the second power stage using a second ADC;
   (c) determining a current level through the speaker; and
   (d) characterizing the operation of the audio system based on (i) the samples of the first voltage drop only during first time periods in which the samples of the first voltage drop and the current level through the speaker are both positive and (ii) the samples of the second voltage drop only during second time periods, different from the first time periods, in which the samples of the second voltage drop and the current level through the speaker are both negative.

2. The method of claim 1, wherein the first and second ADCs are continuous-time sigma-delta ADCs.

3. The method of claim 1, wherein the method is performed during run-time operations of the audio system when the speaker is being driven to produce sound.

4. The method of claim 1, wherein the method is performed during start-up operations of the audio system when the speaker is not being driven to produce sound.

5. The method of claim 1, wherein step (c) comprises using the samples of the first voltage drop and ON resistance of the first transistor to determine the current level through the speaker.

6. The method of claim 1, further comprising detecting an open-load fault based on a decrease in the samples of the first voltage drop.

7. The method of claim 1, further comprising detecting a shorted-load fault based on an increase in the samples of the first voltage drop accompanied by an increase in load current.

8. The method of claim 1, further comprising detecting transistor over-heating based on an increase in the samples of the first voltage.

9. The method of claim 1, further comprising detecting a short-to-Vdd fault based on a detected increase in the first ADC output.

10. The method of claim 1, further comprising detecting a short-to-Vss fault based on a detected decrease in the first ADC output.

11. The method of claim 1, wherein step (d) comprises:
   (d1) monitoring magnitude of an input signal to the amplifier to determine whether the audio system is in an under-drive condition; and
   (d2) characterizing the operation of the audio system based on the samples of the first and second voltage drops only when the audio system is not in an under-drive condition.

12. The method of claim 1, wherein step (d) comprises:
   (d1) monitoring magnitude of an input signal to the amplifier to determine whether the audio system is in an over-drive condition; and
   (d2) adjusting thresholds and characterizing the operation of the audio system based on the samples of the first and second voltage drops using the adjusted thresholds when the audio system is in an over-drive condition.

13. The method of claim 1, wherein step (d) comprises:
   (d1) monitoring frequency of an input signal to the amplifier to determine whether the frequency is above a specified high-frequency threshold; and
   (d2) characterizing the operation of the audio system based on the samples of the first and second voltage drop only when the frequency is below the specified high-frequency threshold.

14. The method of claim 1, wherein step (d) comprises:
   (d1) monitoring the measured first voltage drop to identify high ripple-current periods of the audio system; and
   (d2) characterizing the operation of the audio system based on the samples of the first and second voltage drops only when the audio system is not in a high ripple-current period.

15. The method of claim 1, wherein step (d) comprises characterizing the operation of the audio system based on the samples of the first and second voltage drops only when the audio system is not in known lag-time period.

16. The method of claim 1, wherein ON resistance of the first transistor is determined during start-up operations by:
   turning on at least part of the first transistor;
   injecting a known current into the amplifier;
   measuring the voltage drop across the first transistor using the first ADC; and
   determining the ON resistance from the known current and the measured voltage drop.

17. The method of claim 1, wherein:
step (a) comprises:
(a1) turning on at least part of the first transistor;
(a2) injecting a known AC current into the amplifier;
(a3) measuring the voltage drop across the first transistor using the first ADC; and
step (d) comprises determining one or more AC characteristics of the audio system based on one or both of the known AC current and the measured first voltage drop.

18. The method of claim 1, wherein:
step (a) comprises:
(a1) turning on at least part of the first transistor;
(a2) injecting a known DC current into the amplifier;
(a3) measuring the voltage drop across the speaker and the first transistor using the first ADC; and
step (d) comprises determining one or more DC characteristics of the audio system based on one or both of the known DC current and the measured first voltage drop.

19. The method of claim 1, wherein:
step (a) comprises:
(a1) turning on at least part of the first transistor;
(a2) injecting a known shifted AC current into the amplifier;
(a3) measuring the voltage drop across the first transistor using the first ADC; and
step (d) comprises determining one or more DC characteristics and one or more AC characteristics of the audio system based on one or both of the known shifted AC current and the measured first voltage drop.

20. The method of claim 1, wherein lag time of the audio system is determined during start-up operations by:
injecting a known AC current into the amplifier with at least part of one of the transistors turned on;
measuring voltages on either side of the speaker; and
determining the lag time based on a time difference between peaks in the two measured voltages.

21. An audio system comprising:
an amplifier having first and second power stages configurable to drive a speaker, each power stage comprising two transistors connected in series;
a first ADC connected to generate samples of a first voltage drop across a first of the transistors in the first power stage;
a second ADC connected to generate samples of a second voltage drop across a first of the transistors in the second power stage; and
a processor connected to (1) determine a current level through the speaker and (2) characterize the operation of the audio system based on (i) the samples of first voltage drop only during first time periods in which the samples of the first voltage drop and the current level through the speaker are both positive and (ii) the samples of the second voltage drop only during second time periods, different from the first time periods, in which the samples of the second voltage drop and the current level through the speaker are both negative.

22. The audio system of claim 21, wherein the audio system is designed to operate from about +10 volts to about −10 volts at current levels up to about 2 amps for a peak power through the speaker at about 40 watts.

23. The method of claim 1, wherein, during steps (a) and (b), the audio system operates from about +10 volts to about −10 volts at current levels up to about +/−2 amps for a peak power through the speaker of about 40 watts.

24. The audio system of claim 21, wherein:
the first ADC is a continuous-time sigma-delta ADC connected by a first pair of resistors across the first transistor of the first power stage; and
the second ADC is a continuous-time sigma-delta ADC connected by a second pair of resistors across the first transistor of the second power stage.

25. The method of claim 1, wherein:
the first ADC is a continuous-time sigma-delta ADC connected by a first pair of resistors across the first transistor of the first power stage; and
the second ADC is a continuous-time sigma-delta ADC connected by a second pair of resistors across the first transistor of the second power stage.

* * * * *